United States Patent [19]

Koel et al.

[11] 4,453,232

[45] Jun. 5, 1984

[54] DEVICE FOR GENERATING MAGNETIC BUBBLES WITH A HIGH BIT RATE

[75] Inventors: Gerrit J. Koel; Karel E. Kuijk, both of Eindhoven, Netherlands

[73] Assignee: U.S. Philips Corporation, New York, N.Y.

[21] Appl. No.: 532,297

[22] Filed: Sep. 14, 1983

Related U.S. Application Data

[63] Continuation of Ser. No. 336,236, Dec. 31, 1981, abandoned.

[30] Foreign Application Priority Data

Jan. 19, 1981 [NL] Netherlands .......................... 8100216

[51] Int. Cl.$^3$ ............................................... G11C 19/08
[52] U.S. Cl. ........................................ 365/41; 365/36
[58] Field of Search ..................................... 365/36, 41

[56] References Cited

U.S. PATENT DOCUMENTS 4,253,159  2/1981  Nelson ................................. 365/36
4,360,904  11/1982  Gergis ................................. 365/36

OTHER PUBLICATIONS

Almasi, G. et al., "Nucleation of 1-μm Bubble via Charged Walls," IEEE Tran. on Magnetics, vol. MAG-16, No. 1, Jan. 1980, pp. 89-93.

Lin, Y. S. et al., "Contiguous Disc Bubble Domain Devices," IEEE Trans. on Magnetics, vol. MAG-13, No. 6, Nov. 1977, pp. 1744-1765.

Primary Examiner—James W. Moffitt
Attorney, Agent, or Firm—Marc D. Schechter

[57] ABSTRACT

A memory device utilizing magnetic bubbles which are driven by a rotary magnetic field on contiguous disc drive patterns. These disc patterns have mainly a first scale. Each drive pattern also comprises a further disc pattern of a substantially larger scale. These further disc patterns each time comprise an excitation loop. These loops are mutually staggered with respect to the phase of the rotary field and are electrically connected in series. The series connection can be excited during relevant phases of the rotary magnetic field in order to selectively process a bubble then present in a locally formed preferred position from among the magnetic bubbles present on the larger disc patterns. The processing operation may be generating, detecting and annihilating bubbles.

13 Claims, 5 Drawing Figures

DEVICE FOR GENERATING MAGNETIC BUBBLES WITH A HIGH BIT RATE

This is a continuation of application Ser. No. 336,236, filed Dec. 31, 1981 now abandoned.

BACKGROUND OF THE INVENTION

The invention relates to a device for the storage of digital information in the form of magnetic bubbles in a magnetizable layer located in a bias magnetic field which extends transverse to the layer. The device comprises a number of drive patterns which are in the form of contiguous disc patterns of mainly a first scale. Each of the drive patterns comprise a generator element for generating magnetic bubbles which represents a first access element, and a detector element for detecting magnetic bubbles which represents a second access element. Each of the access elements comprise an excitation loop which can be selectively controlled by an electric current. A rotary field generator is provided for driving bubbles along the relevant drive patterns by way of a rotary magnetic field.

A device of this kind is known from the article by G. Almasi, et al entitled "Nucleation of 1-μm" "Bubbles via Charged Walls" (IEEE Trans. on Magnetics, Vol. MAG-16, No. 1, Jan. 1980, pages 89-93. A contiguous disc pattern is to be understood to mean herein a pattern of contiguous more or less disc-shaped elements or rhombic elements. It is formed, notably, by local implantation of ions. Small scale deviations from the basic shape may occur due to edge effects. Due to the fact that the disc patterns are contiguous, the drive patterns have the appearance of straight or curved strips whose edges exhibit a given serration. The domains are driven along these edges. The scale can be defined, for example, as the mean period of the serration.

FIG. 4 of the article by Almasi et al shows a number of drive patterns, each of which comprises a generator loop. The generator loops being electrically connected in series.

The advantage of this contiguous disc technology is that the sizes of the magnetic bubbles may be comparatively small with respect to the smallest detail of the geometry of the drive patterns (for example, in comparison with drive structures comprising T-shaped and I-shaped patterns of vapor-deposited permalloy). If the smallest details to be realized have a fixed dimension which is determined by the technology, therefore, comparatively small bubble diameters can be used. As a result, a high information density can be realized. Due to the small diameters of the bubbles used, the scale of the excitation loops will be large in comparison with the dimensions of the magnetic bubbles. Thus, the mutual positioning of drive patterns and excitation loops is subject to severe requirements as regards accuracy.

SUMMARY OF THE INVENTION

It is an object of the invention to provide a device of the kind described above in which for each period of the rotary magnetic field, access operations can be performed on the bubble information in different phases thereof. As a result, series and parallel operations are combined without giving rise to a substantial increase in the number of control wires for the access elements, while, moreover, a large tolerance range exists as regards the values of the various operational parameters.

According to the invention, contiguous disc patterns having a larger scale are provided at selected locations. As a result, no excessive requirements will be imposed as regards the accuracy of the mutual positioning of the larger disc pattern and an associated excitation loop. Relevant streams of information-carrying bubbles are processed at contiguous disc patterns of a second scale which is at least 1.8 times larger than the first scale. These larger contiguous disc patterns are each associated with a corresponding element of a series of access elements, the relevant excitation loops of the series being included in a first series connection for an excitation current. The first series connection is excitable at least twice per period of the rotary magnetic field in relevant, different phases of the rotary magnetic field. The excitation loops are staggered on the larger disc patterns with phase differences of less then 360° for the selective processing, under the control of an excitation current pulse, of a bubble from the series of magnetic bubbles present on these access elements. Each bubble present in a locally formed preferred position.

Thus, for each period of the rotary magnetic field, the series of access elements is addressed a number of times. Bubble information is processed, each time the series is addressed, in only one of these access elements. "Processing" is to be understood to mean herein the generating of bubble information, the detection of bubble information or the annihilation of bubble information. Thus, each time the series is addressed, an interaction occurs between a signal (the absence or presence of a bubble at a bubble position) in the magnetic (contiguous disc) circuit, and a signal outside the magnetic circuit, i.e. on the excitation loop.

It has been found that a scale which is a factor of 1.8 times larger than the basic scale enables one to provide different excitation loops with mutually different phases. This is subject to the choice of the first or basic scale. The second scale may also be, for example, three times larger than the first scale. In that case several excitation loops can be included in the same series or the first scale may be chosen to be smaller. The mutual phase differences between successive elements of the series may be ≦90°. In that case a comparatively large number of excitation loops can be included in the same series.

The access elements of said series may be detection elements, the excitation current pulse being capable of stretching a magnetic bubble present within the excitation loop. Inside the excitation loop there may be provided a magnetoresistance element which is connected to a detection circuit. When a number of information-containing bubbles (or empty bubble locations) in the relevant drive patterns are transported in parallel to the larger disc pattern, they will be detected in different phases of the rotary magnetic field. Because the excitation loops are connected in series, only a limited number of external connections will be required. If the magnetoresistance elements are also connected in series, again only a small number of external connections will be required, and a parallel/series conversion will be realized.

The access elements of the series may be selectively activatable generator elements in that the excitation pulse can selectively annihilate a magnetic bubble present in the excitation loop. The drive patterns are each associated with a second excitation loop which operates in the same phase and which acts as a generator loop. The second excitation loop is included in a second series connection for an excitation current pulse which can be activated at most once per period of the rotary magnetic field. For each drive pattern a bubble path extends from the generator loop to a storage structure for magnetic bubbles via the access element. Thus, a number of bubbles are generated in parallel in the same phase of the rotary magnetic field, are subsequently transported to the further disc pattern of larger scale, and are selectively annihilated or not annihilated in different phases of the magnetic field in order to assign the information "0" or "1" thereto. Subsequently, the information-containing bubbles or void bubble positions are transported to a storage structure.

This embodiment of the invention is based on the following considerations:

(a) In the same generator loop, a bubble is generated only once per period of the rotary magnetic field. As a result, the phase tolerance in the relevant excitation current pulse is comparatively large. Furthermore, the current pulses may have a comparatively long duration without successive current pulses adversely affecting one another.

(b) When use is made of drive patterns formed by means of the ion implantation technique, the dimension of the bubbles will be independent of the local scale of the drive patterns. The tolerance as regards the intensity of the bias magnetic field will not be affected either by a larger scale.

(c) As a result of the larger scale of the larger disc patterns, they offer more room for the second excitation loop, so that the location of the loop need not satisfy very narrow tolerances. It is also easier to annihilate a bubble than to generate a bubble. Therefore, the generating operation is performed only once per rotary field period in parallel. The information is imparted to the bubbles by selective annihilation. The excitation current pulses for annihilation require only a comparatively short duration. Therefore, it is not objectionable that the same series connection must be capable of performing an annihilation, for example, eight times per rotary field period.

(d) The excitation frequency of the annihilation is higher than the rotary field frequency. As a result, a high bit rate can be realized on the information input. A series/parallel conversion is implicitly realized.

It is also to be noted that the above selective annihilation can be used for the selective modification of the information of a stream of information-containing bubbles, for example, selective erasing.

DESCRIPTION OF THE PREFERRED EMBODIMENTS

Figure 1:
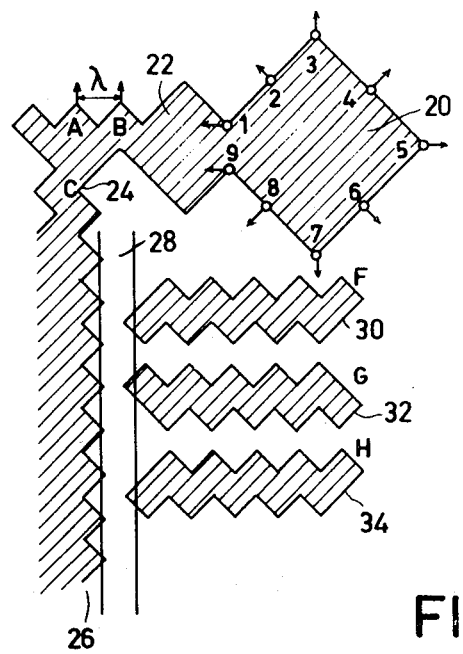
FIG. 1 schematically shows a drive pattern for use in a device according to the invention.

FIG. 1 shows a drive pattern for use in a device according to the invention. The disc patterns are shown as rhombi. As has already been stated, the technology may cause small scale deviations during the manufacture thereof. The domains travel along the serrated edges of the drive patterns. The normal scale of the drive patterns is defined as the period of the serration, $\lambda$, of the edge. For example, in FIG. 1 is the distance between A and B.

The same normal scale occurs below point C. The reference 20 denotes a disc pattern having a scale which is a factor of 4 times larger in this embodiment than that of the disc patterns at the left and bottom of the Figure. Arrows on the disc element 20 indicate nine preferred positions on the edge of disc 20 for a bubble (1 to 9). These edge positions are successively preferred as the rotary magnetic field rotates to the direction corresponding to the direction of the arrow shown at each of these points. When the rotary field rotates clockwise, the bubbles will travel from the edge position "1" to the edge position "9". In reaction to further rotation of the rotary field, the bubbles will first move along the lower side of the disc element 22 and subsequently, via position 24, in the direction of position 26.

There are also three drive patterns 30, 32, and 34, each of which comprises a closed loop for the bubbles. A conductor 28 is arranged on the plate of magnetic material between the drive pattern 24/26 and the drive patterns 30, 32, and 34. This conductor is to be excited by a current pulse generator (not shown), so that three bubbles can be transported in parallel between these drive patterns. A transport of this kind is known per se. FIG. 1 is not true to scale in this respect. Thus, an attractive storage structure with main loops and auxiliary loops is formed for magnetic bubble memories.

Figure 2:
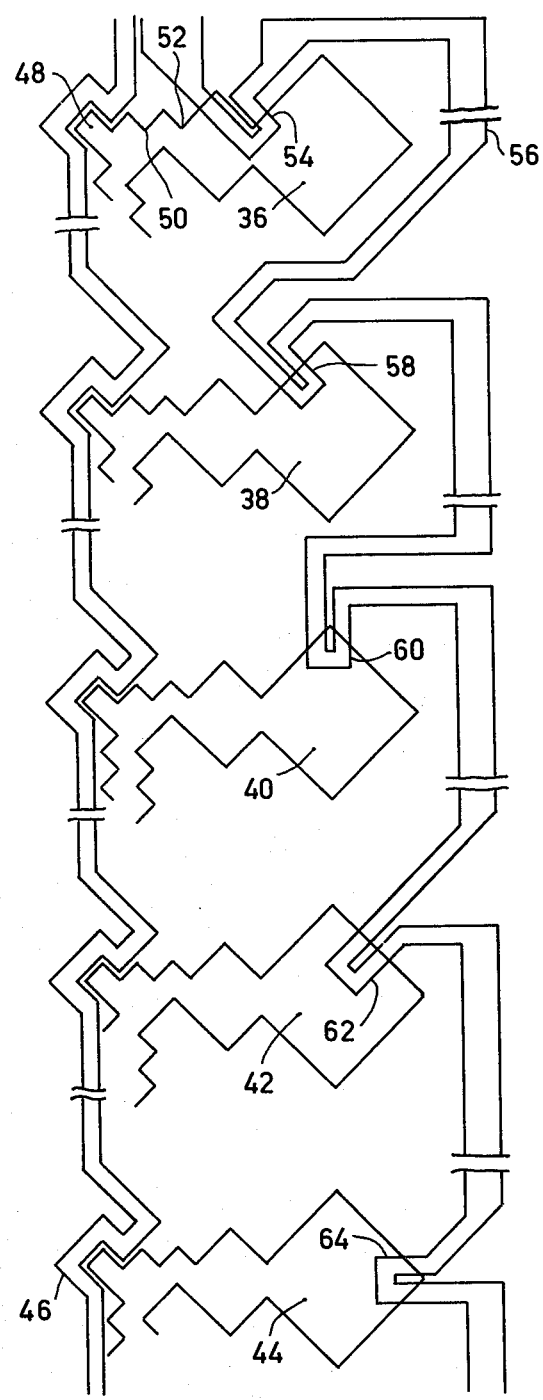
FIG. 2 schematically illustrates the generator elements of a number of drive patterns.

An element for generating a stream of information-containing bubbles will be described with reference to FIG. 2. A bubble detector element may be connected to the main loop according to the known technique. Another detection technique will be described hereinafter with reference to the FIGS. 4 and 5. The bubble detector element can be connected to a number of drive patterns together with or without an element according to FIG. 2. Only the right edge of the pattern of the segment 24–26 is shown in FIG. 2. For the formation of the drive pattern for the magnetic bubbles the left edge is not of importance in this respect, so it need not be described either. Patterns of this kind are also covered by the customary interpretation of "contiguous disc pattern". The disc pattern 22 has a scale which is approximately twice as large as the standard scale (lower part of the figure). In some cases the change from the scale of the element 20 to the standard scale can be realized in one step. In other cases more than one intermediate step (such as the element 22) will be necessary.

FIG. 2 illustrates the generator elements of a number of drive patterns. They are provided together on a single layer of magnetic material. Only the part of each of these drive patterns which corresponds to the part above and to the right of the indication 24 in FIG. 1 is shown. FIG. 2 shows five drive patterns 36, 38, 40, 42, and 44. Each of the drive patterns comprises a first excitation loop which forms part of a current conductor 46 provided on the plate of magnetic material. When the rotary field has the direction indicated in FIG. 1 at the element 20, position 2, the bias magnetic field inside the excitation loop can be counteracted by a suitable current pulse in the conductor 46 to such an extent that a new bubble is formed at this area by nucleation. For all of the drive patterns 36, 38, 40, 42, and 44, this condition is currently satisfied, so that five bubbles are generated in parallel.

The rotary magnetic field which biases the magnetic layer rotates clockwise. The bubbles generated at 48 and corresponding areas are driven so that they are retained for approximately one half of a rotary field cycle in a valley of the drive pattern (for example, at the reference 50) and subsequently they travel to the next valley (for example to the reference 52) during a next half cycle of the rotary field in order to remain there for another half period. In the outside of a bend (for example, along the disc pattern 20 in FIG. 1), more time is required to proceed from one valley to the next valley. In the inside of a bend, (for example, at the reference 24 in FIG. 1), less time is required.

The bubbles are generated at the position 48 when the rotary magnetic field is directed according to the arrow "2" (FIG. 1). Approximately $3\frac{3}{8}$ cycles of the rotary field are then necessary to transport the bubble to the position "1" in FIG. 1. At that instant, but preferably after $3\frac{7}{8}$ cycles of the rotary field, the excitation loop 54 can be activated by a current pulse in the conductor 56 so that the bias magnetic field is locally intensified and a bubble present at position 1 is annihilated. After another $\frac{1}{8}$ cycle of the rotary magnetic field, that is, after four cycles from the generation of bubble, a bubble can be annihilated at the area of the excitation loop 58 on the drive pattern 38. After $4\frac{1}{8}$ cycles, a bubble can be annihilated at the area of the excitation loop 60 on the drive pattern 40. After 4 2/8 cycles, a bubble can be annihilated at the area of the excitation loop 62 on the drive pattern 42. After $4\frac{3}{8}$ cycles, a bubble can be annihilated at the area of the excitation loop 64 on the drive pattern 44.

Further drive patterns are not shown. However, it is also possible to provide further drive patterns which comprise excitation loops which are a mirror image of the relevant excitation loops 54, 58, 60, and 62 in FIG. 2. If only a single excitation of the conductor 46 takes place, so that only a single row of bubbles is simultaneously generated, the conductor 56 can be excited in eight different phases of the rotary magnetic field for the selective annihilation each time of one bubble of a row of eight bubbles. It is to be noted, however, that the situation will be different if a continuous row of the bubbles is generated in each cycle of the rotary magnetic field. When the first row of bubbles has reached the positions which correspond to the loop 64, the next row will already have reached the positions of the loop 54 again. This is because this row remains stationary at this area 54 for approximately one half cycle of the rotary magnetic field. If the loop 54 is not used and its mirror image (at position 9 in FIG. 1) is not used either, the conductor 56 in the configuration shown can be excited seven times per cycle of the rotary field in order to annihilate a magnetic bubble. The conductor 46 can then be excited once per cycle of the rotary magnetic field in order to generate these bubbles.

Figure 3:
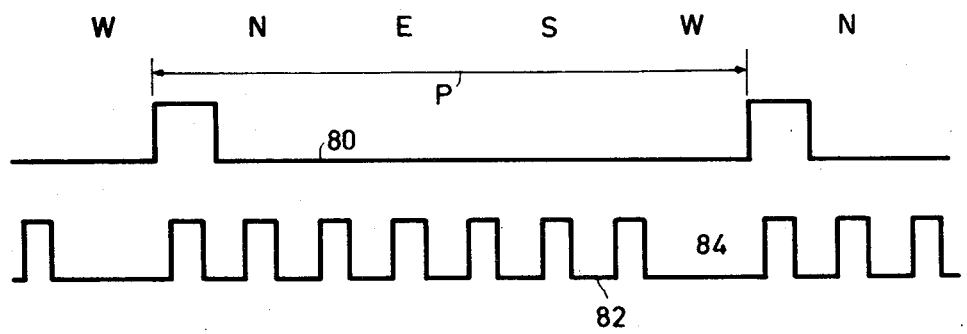
FIG. 3 graphically shows a the currents in the excitation loops as a function of time.

FIG. 3 in this respect shows a time diagram of the currents in the excitation loops. Curve 80 shows the excitation of the conductor 46. This excitation operation takes place once per cycle. The length of the cycle of the rotary magnetic field is indicated by the arrow P. Curve 82 shows the excitation of the conductor 56. Thus, with the orientations each time shifted through 45° according to FIG. 2, this conductor can be excited at most seven times per cycle for the selective introduction of information. Therefore, only at the phase "North-West" (corresponding to arrow "2") does a pulse occur on the curve 80. On the curve 82 only at the phase "West" is a pulse absent. The excitation pulse of curve 80 may be longer than that shown. In other cases a larger or smaller number of loops may be used per period.

Figure 4:
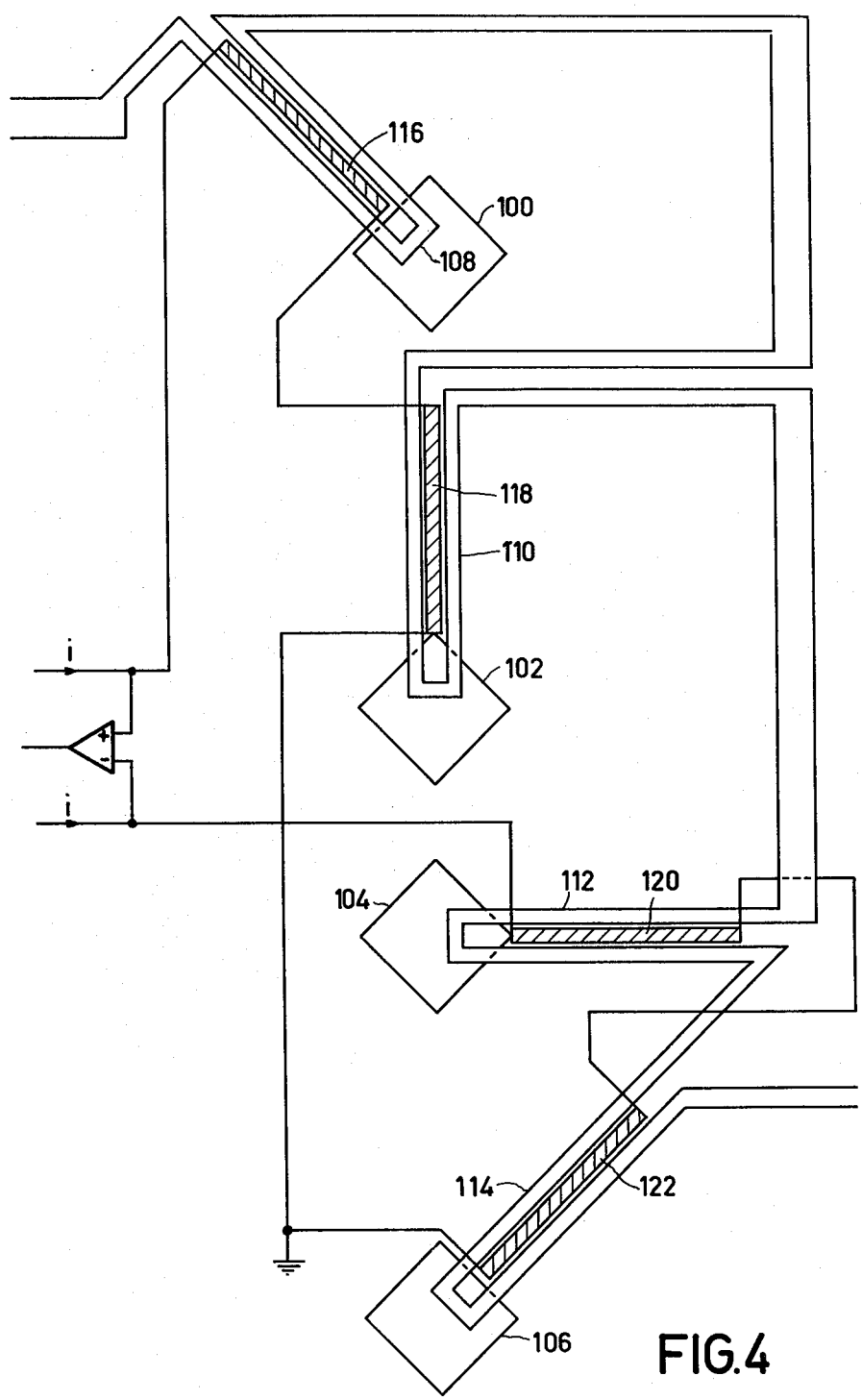
FIG. 4 schematically illustrates the detector elements of a number of drive patterns.

FIG. 4 illustrates the detector elements of a number of drive patterns. Four such patterns (100, 102, 104, and 106) having this larger scale are shown. They may be connected to the remainder of the drive patterns in the same way as shown in FIG. 2 for the disc patterns 36, 38, 40, 42, and 44. These connections have been omitted in FIG. 4 for the sake of clarity. On these disc patterns there are arranged the excitation loops 108, 110, 112, and 114 according to relevant orientations which differ by 45° in this embodiment. They are connected in series for an excitation current which is activated in the relevant phases of the rotary magnetic field, exactly like the loops 54, 58, 60, 62 and 64 in FIG. 2. The generator for the excitation current is not shown.

Inside the excitation loops there are provided magnetoresistance elements 116, 118, 120, and 122 which are denoted by shading. These elements consist of permalloy provided on the plate of magnetic material. They are excited by a measuring current, the voltage drop being determined by the resistance which depends on a locally present magnetic bubble. The elements 116 and 118 are electrically connected in series, as are the elements 120 and 122. Each pair serves each time as a reference detector (dummy) for the other pair. As a result, the disturbances by the rotary magnetic field are compensated for.

The following remarks can be made as regards the dimensions. The period of the serration of the drive patterns amounts to, for example, four times the bubble diameter in the normal scale. The diagonal of the elements having the second scale (100, 102 ...) is then, for example, four times larger. Thus, for a bubble diameter of 2 microns, the diagonals of the large patterns will then be 32 micrometers. The length of the magnetoresistive elements will then be, for example, approximately 60 microns, regardless of the orientation.

Figure 5:
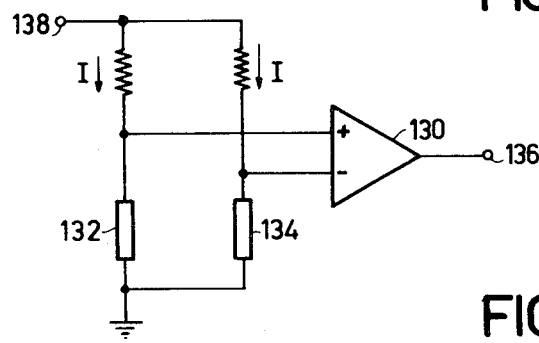
FIG. 5 schematically shows a detection circuit.

FIG. 5 is a detailed representation of a detection circuit. The terminal 138 receives the measuring current which is divided into two equal parts by the resistors shown. If the resistor 132 represents the measuring resistance, the resistance 134 will form the reference detector and vice versa. The signals are received by the differential amplifier 130 which, therefore, can generate a detection signal four times per period of the rotary field in this embodiment. The waveform of the detector currents is as shown in FIG. 3, curve 82, but reversed, so that now the field inside the exciation loops has to be decreased. The duration of an excitation pulse must be sufficient to enable a magnetic bubble to cover the entire associated magnetoresistance element by expansion. There must also be a sufficient period of time available for the subsequent contraction. In the set-up shown in FIG. 4, the measuring resistance as well as the reference resistance are formed by two of the elements 116, 118, 120, and 122 in series. The roles of measuring resistance and reference resistance are then reversed once each cycle. Thus, a given parallel/series conversion is realized. The information successively appears on the output 136 of the differential amplifier 130.

What is claimed is:
1. A device for storing digital information in the form of magnetic bubbles, said device comprising:
    a substantially planar magentizable layer capable of supporting magnetic bubbles therein;

at least two drive patterns in the layer, each of said drive patterns comprising a first contiguous disc pattern having substantially a first scale; and means for generating a magnetic field having at least one component rotating in the plane of the magnetizable layer;

characterized in that:

each drive pattern further comprises a second disc pattern contiguous with the first pattern, said second pattern having a second scale which is at least 1.8 times larger than the first scale, each of said second disc patterns having an edge, the edges of the second disc patterns having at least first and second positions which separately correspond uniquely to preferred bubble positions at different angles of rotation of the rotating magnetic field, rotation of the rotating magnetic field from the first edge position to the second edge position requiring a rotation of less than 360°;

first means for processing magnetic bubbles, said first bubble-processing means being located at the first edge position on one second disc pattern;

second means for processing magnetic bubbles, said second bubble-processing means being located at the second edge position on the other second disc pattern, said first and second bubble-processing means being activatable only concurrently.

2. A device for storing digital information in the form of magnetic bubbles, said device comprising:

a substantially planar magnetizable layer capable of supporting magnetic bubbles therein;

means for generating a bias magnetic field transverse to and through the magnetizable layer;

at least two drive patterns in the layer, each of said drive patterns comprising a first contiguous disc pattern having substantially a first scale;

at least two means for generating magnetic bubbles, one such means being associated with each drive pattern, each bubble-generating means comprising an electrically conductive loop;

at least two means for detecting magnetic bubbles, one such means being associated with each drive pattern, each bubble-detecting means comprising an electrically conductive loop;

means for generating a magnetic field having at least one component rotating in the plane of the magnetizable layer;

characterized in that:

each drive pattern further comprises a second disc pattern contiguous with the first pattern, said second pattern having a second scale which is at least 1.8 times larger than the first scale, each of said second disc patterns having an edge, the edges of the second disc patterns having at least first and second positions which separately correspond uniquely to preferred bubble positions at different angles of rotation of the rotating magnetic field, rotation of the rotating magnetic field from the first edge position to the second edge position requiring a rotation of less than 360°;

a first electrically conductive loop around the first edge position on one second disc pattern;

a second electrically conductive loop around the second edge position on the other second disc pattern, said first and second loops being electrically connected to each other in series.

3. A device as claimed in claim 2, characterized in that:

the electrically conductive loops of the bubble-detecting means are the first and second electrically conductive loops at the edge positions;

each bubble-detecting means further comprises a detection circuit and a magnetoresistance element connected to the detection circuit; and the device further comprises means for passing an electric current pulse through the series-connected first and second electrically conductive loops, said current pulse being capable of expanding a magnetic bubble present in a loop so that the bubble extends at least partially under the magnetoresistance element.

4. A device as claimed in claim 2, characterized in that:

the electrically conductive loops of the bubble-generating means are the first and second electrically conductive loops at the edge positions; and the device further comprises:

means for passing an electric current pulse through the series-connected first and second electrically conductive loops, said current pulse being capable of annihilating a magnetic bubble present in a loop;

means for concurrently generating, once per cycle of the rotating magnetic field, magnetic bubbles in both drive patterns, said magnetic bubbles being generated in each drive pattern at locations which are temporally equidistant from the second disc pattern; and means for storing magnetic bubbles which have passed through the second disc pattern.

5. A device as claimed in claim 2, characterized in that rotation of the rotating magnetic field from the first edge position to the second edge position requires a rotation of not more than 90°.

6. A device as claimed in claim 5, characterized in that:

the electrically conductive loops of the bubble-detecting means are the first and second electrically conductive loops at the edge positions;

each bubble-detecting means further comprises a detection circuit and a magnetoresistance element connected to the detection circuit; and the device further comprises means for passing an electric current pulse through the series-connected first and second electrically conductive loops, said current pulse being capable of expanding a magnetic bubble present in a loop so that the bubble extends at least partially under the magnetoresistance element.

7. A device as claimed in claim 5, characterized in that:

the electrically conductive loops of the bubble-generating means are the first and second electrically conductive loops at the edge positions; and the device further comprises:

means for passing an electric current pulse through the series-connected first and second electrically conductive loops, said current pulse being capable of annihilating a magnetic bubble present in a loop;

means for concurrently generating, once per cycle of the rotating magnetic field, magnetic bubbles in both drive patterns, said magnetic bubbles being generated in each drive pattern at locations which are temporally equidistant from the second disc pattern; and means for storing magnetic bubbles which have passed through the second disc pattern.

8. A device as claimed in claim 2, characterized in that the second scale is at least three times larger than the first scale.

9. A device as claimed in claim 8, characterized in that:
- the electrically conductive loops of the bubble-detecting means are the first and second electrically conductive loops at the edge positions;
- each bubble-detecting means further comprises a detection circuit and a magnetoresistance element connected to the detection circuit; and
- the device further comprises means for passing an electric current pulse through the series-connected first and second electrically conductive loops, said current pulse being capable of expanding a magnetic bubble present in a loop so that the bubble extends at least partially under the magnetoresistance element.

10. A device as claimed in claim 8, characterized in that:
- the electrically conductive loops of the bubble-generating means are the first and second electrically conductive loops at the edge positions; and
- the device further comprises:
- means for passing an electric current pulse through the series-connected first and second electrically conductive loops, said current pulse being capable of annihilating a magnetic bubble present in a loop;
- means for concurrently generating, once per cycle of the rotating magnetic field, magnetic bubbles in both drive patterns, said magnetic bubbles being generated in each drive pattern at locations which are temporally equidistant from the second disc pattern; and
- means for storing magnetic bubbles which have passed through the second disc pattern.

11. A device as claimed in claim 8, characterized in that rotation of the rotating magnetic field from the first edge position to the second edge position requires a rotation of not more than 90°.

12. A device as claimed in claim 11, characterized in that:
- the electrically conductive loops of the bubble-detecting means are the first and second electrically conductive loops at the edge positions;
- each bubble-detecting means further comprises a detection circuit and a magnetoresistance element connected to the detection circuit; and
- the device further comprises means for passing an electric current pulse through the series-connected first and second electrically conductive loops, said current pulse being capable of expanding a magnetic bubble present in a loop so that the bubble extends at least partially under the magnetoresistance element.

13. A device as claimed in claim 11, characterized in that:
- the electrically conductive loops of the bubble-generating means are the first and second electrically conductive loops at the edge positions; and
- the device further comprises:
- means for passing an electric current pulse through the series-connected first and second electrically conductive loops, said current pulse being capable of annihilating a magnetic bubble present in a loop;
- means for concurrently generating, once per cycle of the rotating magnetic field, magnetic bubbles in both drive patterns, said magnetic bubbles being generated in each drive pattern at locations which are temporally equidistant from the second disc pattern; and
- means for storing magnetic bubbles which have passed through the second disc pattern.

* * * * *

UNITED STATES PATENT AND TRADEMARK OFFICE
CERTIFICATE OF CORRECTION

PATENT NO.  : 4,453,232
DATED       : June 5, 1984
INVENTOR(S) : GERRIT J. KOEL ET AL It is certified that error appears in the above-identified patent and that said Letters Patent is hereby corrected as shown below:

In the claims:

Claim 1, line 3, change "magentizable" to --magnetizable--.

Signed and Sealed this

Ninth Day of October 1984

[SEAL]

Attest:

GERALD J. MOSSINGHOFF

Attesting Officer

Commissioner of Patents and Trademarks